United States Patent
Huang

(10) Patent No.: US 9,838,578 B2
(45) Date of Patent: Dec. 5, 2017

(54) FRAME, ASSEMBLING SET AND CAMERA ASSEMBLY SET

(71) Applicant: VIVOTEK INC., New Taipei (TW)

(72) Inventor: Shang-Yu Huang, New Taipei (TW)

(73) Assignee: VIVOTEK INC., New Taipei (TW)

( * ) Notice: Subject to any disclaimer, the term of this patent is extended or adjusted under 35 U.S.C. 154(b) by 2 days.

(21) Appl. No.: 15/158,561

(22) Filed: May 18, 2016

(65) Prior Publication Data

US 2016/0352980 A1   Dec. 1, 2016

(30) Foreign Application Priority Data

May 29, 2015   (TW) .............................. 104117550 A

(51) Int. Cl.
| | |
|---|---|
| *H04N 5/225* | (2006.01) |
| *G08B 13/196* | (2006.01) |
| *H05K 5/00* | (2006.01) |
| *H05K 5/02* | (2006.01) |

(52) U.S. Cl.
CPC ..... *H04N 5/2253* (2013.01); *G08B 13/19632* (2013.01); *H04N 5/2252* (2013.01); *H05K 5/0073* (2013.01); *H05K 5/0204* (2013.01)

(58) Field of Classification Search
None
See application file for complete search history.

(56) References Cited

U.S. PATENT DOCUMENTS 4,299,470 A * 11/1981 Shimizu .................. G02B 7/14
359/826

* cited by examiner

*Primary Examiner* — Mark T Monk
(74) *Attorney, Agent, or Firm* — Maschoff Brennan

(57) ABSTRACT

An assembling set including frame and assembling assembly. The frame includes fixing member and restricting member. The fixing member has through slot having restricting section and releasing section extending along first axis. The restricting member includes main plate and restricting protrusion. The main plate is slidably on the fixing member so that the restricting protrusion is slidable in the through slot along second axis which is nonparallel to the first axis. The assembling assembly includes main body and assembling protrusion. The assembling protrusion protrudes from the main body and in the through slot so as to be restricted in the restricting section or released from the releasing section. When the assembling protrusion is located in the restricting section, and the restricting protrusion is located in the through slot, the assembling protrusion is restricted to be in the restricting section so that the assembling assembly is fixed to the frame.

21 Claims, 11 Drawing Sheets

FRAME, ASSEMBLING SET AND CAMERA ASSEMBLY SET

CROSS-REFERENCE TO RELATED APPLICATIONS

This non-provisional application claims priority under 35 U.S.C. §119(a) on Patent Application No(s). 104117550 filed in Taiwan, R.O.C. on May 29, 2015, the entire contents of which are hereby incorporated by reference.

TECHNICAL FIELD

The disclosure relates to a frame, an assembling set and a camera assembly set, more particularly to a frame, an assembling set and a camera assembly set each having a slidable restricting member.

BACKGROUND

Surveillance cameras are widely used in public places such as factories, dorms, stores, or communities for recording evidence of any possible criminal activity. Thus, the surveillance cameras are able to prevent crimes from occurring and solve crimes by providing valuable evidence to the police.

There are two common types of surveillance cameras: a wide viewing-angle surveillance camera and a bullet-shaped surveillance camera. The wide viewing-angle surveillance camera is able to focus on a relatively wide area since it has a wide viewing angle, thus it is usually directly mounted on the wall or the ceiling by screws.

SUMMARY

The present disclosure provides a frame, an assembling set and a camera assembly set for efficiently assembling the surveillance camera as well as preventing the frame and the assembling set from being exposed.

One embodiment of the disclosure provides an assembling set including a frame and an assembling assembly. The frame includes a fixing member and a restricting member. The fixing member has at least one through slot. The at least one through slot has an restricting section and a releasing section which are connected to each other and extending along a first axis. The restricting member includes a main plate and at least one restricting protrusion. The main plate is slidably disposed on the fixing member so that the at least one restricting protrusion is slidable in the at least one through slot along a second axis. The second axis is nonparallel to the first axis. The assembling assembly includes a main body and at least one assembling protrusion. The at least one assembling protrusion protrudes from the main body and is slidable in the at least one through slot so as to be restricted to be in the restricting section or released from the releasing section. When the at least one assembling protrusion is located in the restricting section of the at least one through slot, and the at least one restricting protrusion is located in the at least one through slot, the at least one assembling protrusion is restricted to be in the restricting section of the at least one through slot by the at least one restricting protrusion so that the assembling assembly is fixed to the frame.

One embodiment of the disclosure provides a frame including a fixing member and a restricting member. The fixing member has at least one through slot. The at least one through slot has an restricting section and a releasing section which are connected to each other and extending along a first axis. The restricting member includes a main plate and at least one restricting protrusion. The main plate is slidably disposed on the fixing member so that the at least one restricting protrusion is slidable in the at least one through slot along a second axis. The second axis is nonparallel to the first axis.

One embodiment of the disclosure provides a camera assembly set including the aforementioned assembling set and a camera. The camera is disposed on the assembling assembly of the assembling set and detachably fixed to the frame of the assembling set through the assembling assembly of the assembling set.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
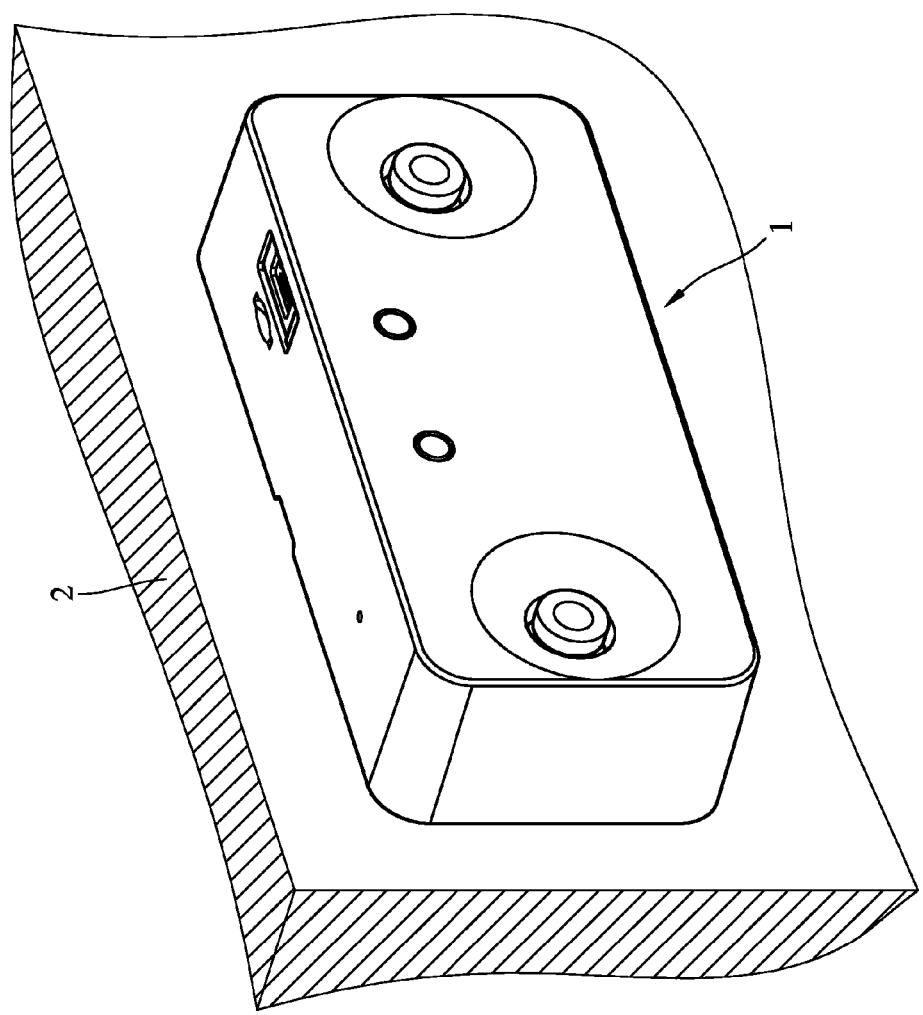
FIG. 1 is a perspective view of a camera assembly set disposed on an object according to a first embodiment of the disclosure.
Figure 2:
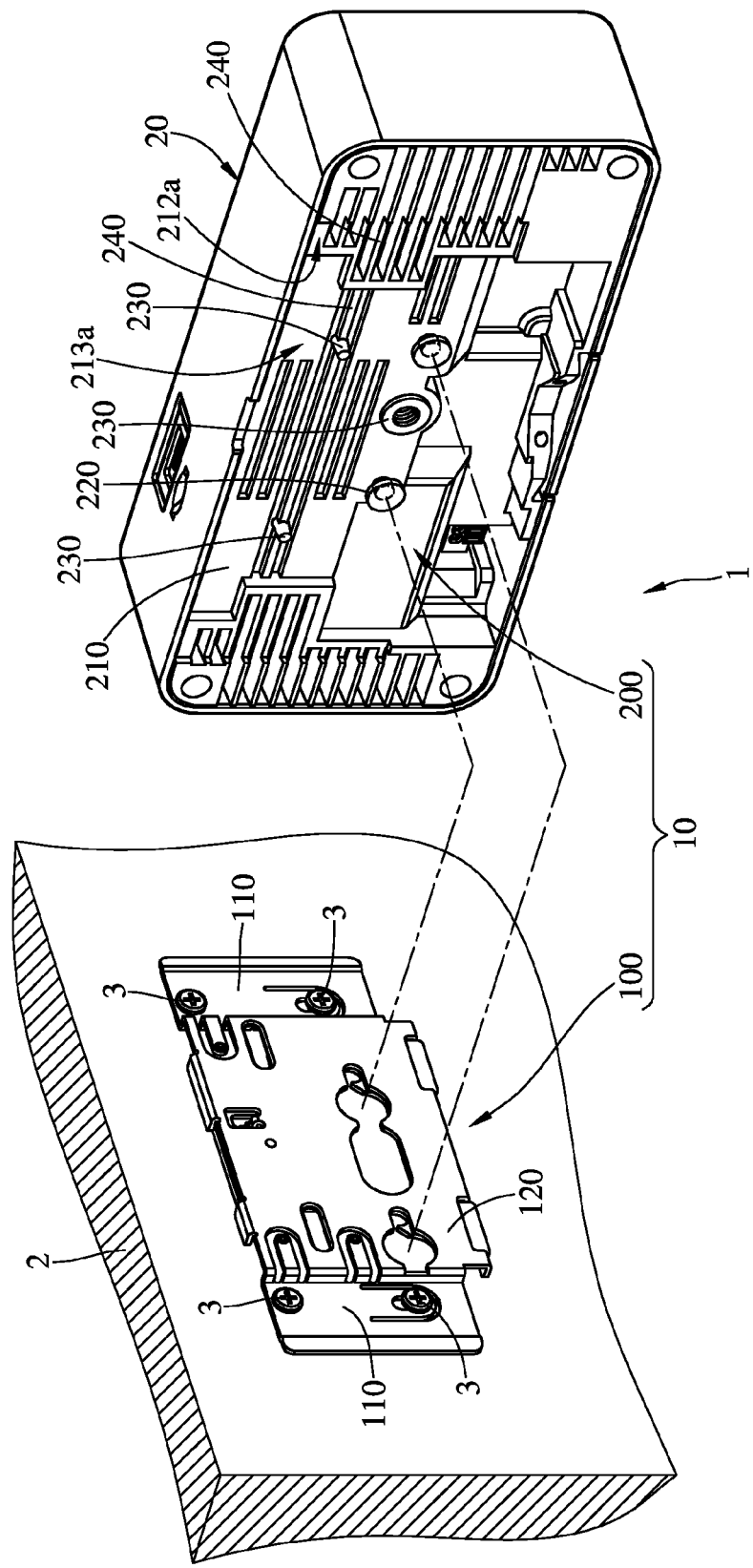
FIG. 2 is an exploded view of the camera assembly set in FIG. 1.
Figure 3:
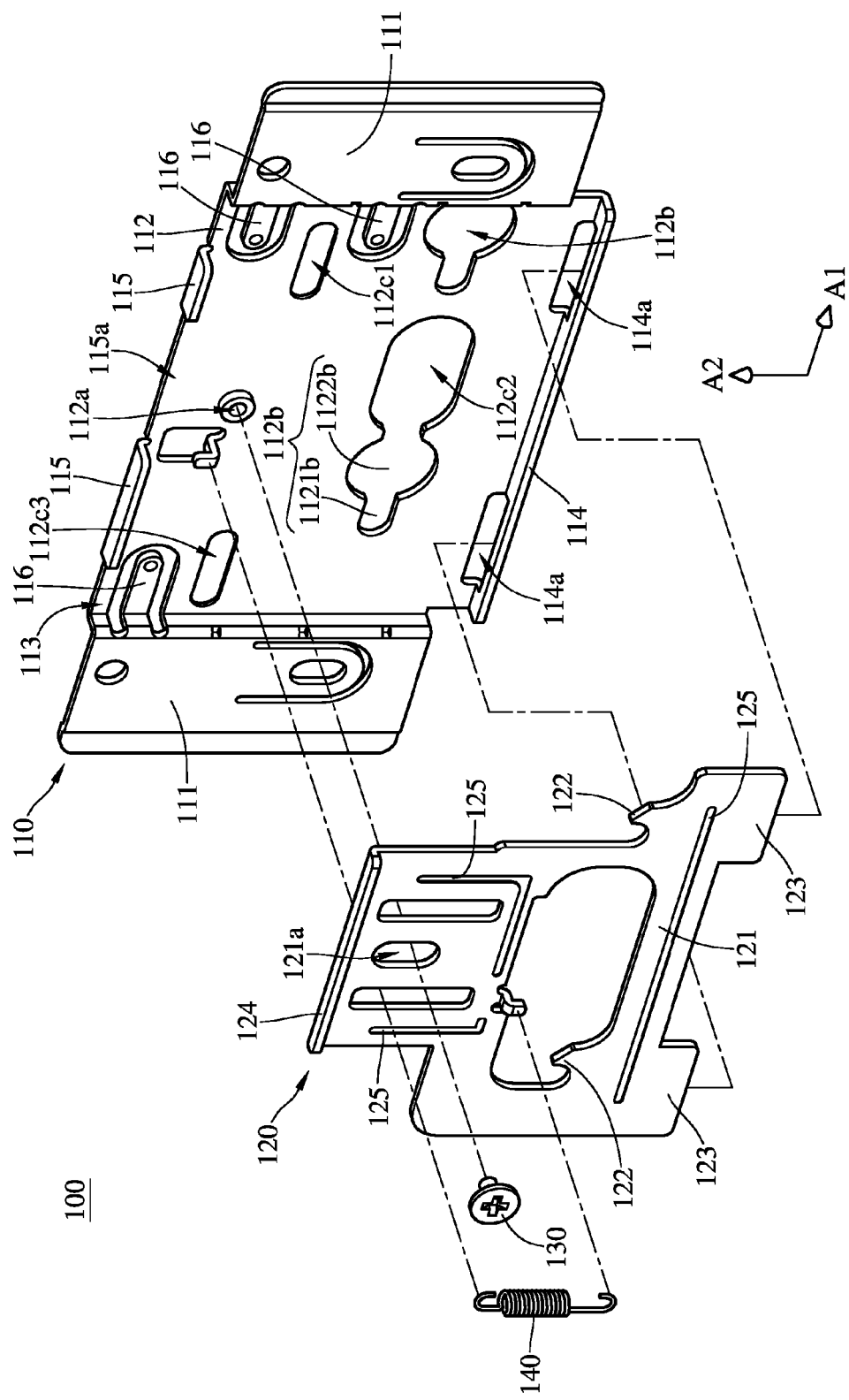
FIG. 3 is an exploded view of a frame in FIG. 2.
Figure 4:
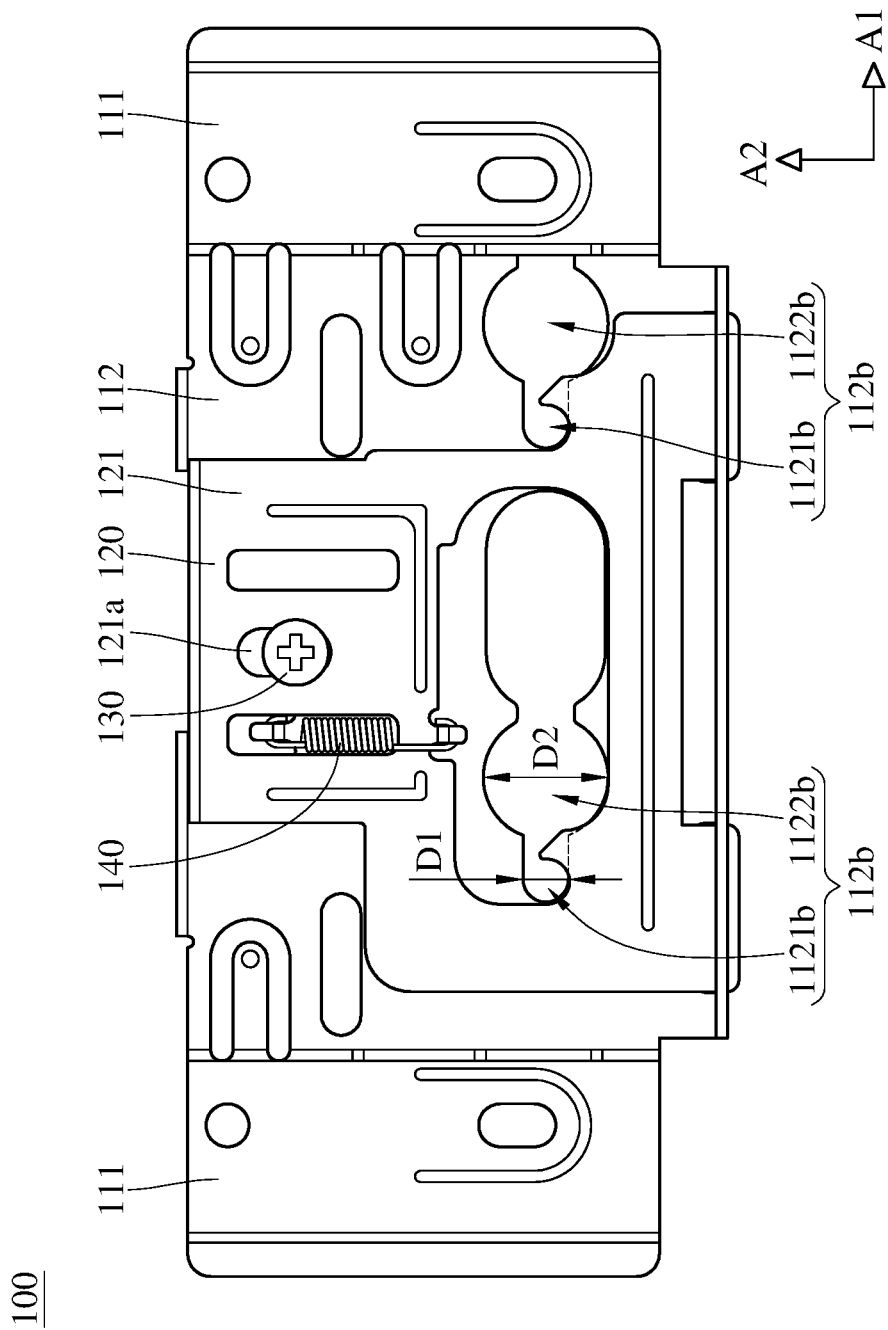
FIG. 4 is a planar view of the frame in FIG. 2.
Figure 5:
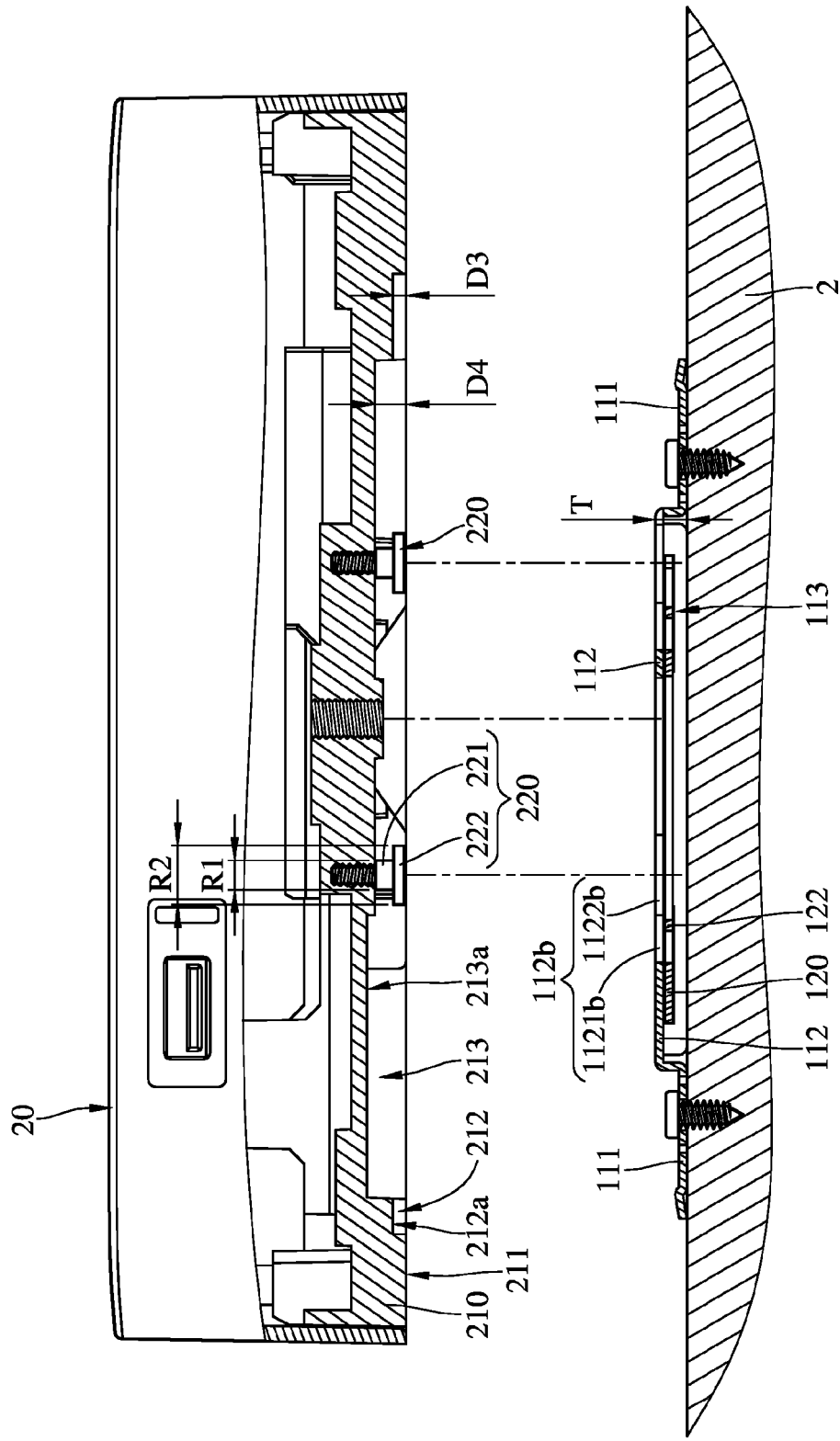
FIG. 5 is a cross-sectional view of the camera assembly set in FIG. 2.

Please refer to FIG. 1 to FIG. 5. FIG. 1 is a perspective view of a camera assembly set disposed on an object according to a first embodiment of the disclosure, FIG. 2 is an exploded view of the camera assembly set in FIG. 1, FIG. 3 is an exploded view of a frame in FIG. 2, FIG. 4 is a planar view of the frame in FIG. 2, and FIG. 5 is a cross-sectional view of the camera assembly set in FIG. 2.

As shown in FIG. 1 to FIG. 2, a camera assembly set 1 is provided. The camera assembly set 1 includes an assembling set 10 and a camera 20. The camera 20 can be detachably fixed to an object 2. In this embodiment, the object 2 is, for example, a wall, but the present disclosure is not limited thereto. In other embodiments, the object 2 can be a ceiling.

As shown in FIG. 2 to FIG. 5. The assembling set 10 includes a frame 100 and an assembling assembly 200. The frame 100 includes a fixing member 110, a restricting member 120, a fastener 130 and a returning member 140.

The fixing member 110 includes two first fixing plates 111 and a second fixing plate 112. The two first fixing plates 111 are connected to two opposite sides of the second fixing plate 112, respectively. There is a rise T (as shown in FIG. 5) existing between each of the first fixing plates 111 and the second fixing plate 112, so the two first fixing plates 111 and the second fixing plate 112 form a depression 113. The two first fixing plates 111 are fixed to the object 2 via, for example, a plurality of fasteners 3. The first fixing plates 111 are closer to the object 2 than the second fixing plate 112. The second fixing plate 112 has an mounting hole 112a, two through slots 112b and positioning slots 112c1-112c3. Each of the through slots 112b has a restricting section 1121b and a releasing section 1122b which are connected together and extending along a first axis A1. As shown in FIG. 4, a width D1 of the restricting section 1121b along a second axis A2 is less than a width D2 of the releasing section 1122b along the second axis A2. The three positioning slots 112c1-112c3 are located at three positions (areas) on the second fixing plate 112, thus the three positioning slots 112c1-112c3 are able to provide three points for positioning the camera 20 (referred to as three-point positioning hereinafter). In this embodiment, the positioning slot 112c2 is connected to one of the through slots 112b so that the volume of the fixing member 110 is reduced.

The present disclosure is not limited to the quantity of the first fixing plates 111. In other embodiments, the quantity of the first fixing plate 111 can be one, and the first fixing plate 111 is connected to one side of the second fixing plate 112.

In addition, the fixing member 110 further includes a first side plate 114, a second side plate 115 and a plurality of flexible arms 116. The first side plate 114 and the second side plates 115 are located between the two first fixing plates 111 and connected to two opposite sides of the second fixing plate 112, respectively. The first side plate 114 has two guiding slots 114a. The second side plate 115 has an opening 115a. The flexible arms 116 are located on two opposite sides of the second fixing plate 112, respectively. In this embodiment, for each of the flexible arms 116, one end of the flexible arm 116 is directly connected to the first fixing plate 111, and the other end of the flexible arm 116 is floating, but the present disclosure is not limited thereto. In other embodiments, the two opposite sides of the flexible arm 116 can be respectively directly connected to the first fixing plate 111 and the second fixing plate 112.

The restricting member 120 includes a main plate 121, two restricting protrusions 122, two guiding protrusions 123, a pressible part 124 and a plurality of bumps 125. The main plate 121 has a third groove 121a. The two guiding protrusions 123 are connected to the main plate 121 and located at the same side of the main plate 121. The pressible part 124 is connected to a side of the main plate 121 which is opposite to the two guiding protrusions 123. The two restricting protrusions 122 are located between the guiding protrusions 123 and the pressible part 124. One end of each of the two restricting protrusions 122 is connected to the main plate 121, and the opposite end of each of the two restricting protrusions 122 extends toward the pressible part 124. The bumps 125 protrude from the main plate 121.

The fastener 130 penetrates through the third groove 121a of the main plate 121 and is fixed to the mounting hole 112a of the second fixing plate 112. The two guiding protrusions 123 of the restricting member 120 slidably penetrate through the two guiding slots 114a of the first side plate 114, respectively, so that the main plate 121 of the restricting member 120 is movable relative to the fixing member 110. In detail, the main plate 121 of the restricting member 120 is able to slide in the depression 113 of the fixing member 110 along the second axis A2. Thus, each of the restricting protrusions 122 on the main plate 121 is slidable between the restricting section 1121b and the releasing section 1122b along the second axis A2. Hence, the restricting protrusion 122 may cover the through slot 112b more or less or may be separated from the through slot 112b when the main plate 121 is being moved along the second axis A2. In addition, the second axis A2 is nonparallel to the first axis A1. In this embodiment, the second axis A2 is substantially orthogonal to the first axis A1, but the present disclosure is not limited thereto. In other embodiments, the second axis A2 is not orthogonal to the first axis A1.

The returning member 140 is connected to the fixing member 110 and the restricting member 120 so as to normally maintain the restricting protrusion 122 in the restricting section 1121b or the releasing section 1122b. The terms "normally" can be refer to a situation that the position of the restricting protrusion 122 is determined by only the elasticity of the returning member 140, applied to the fixing member 110 and the restricting member 120, without any external force.

When the restricting member 120 is assembled to the fixing member 110, and the restricting protrusion 122 normally stops in the restricting section 1121b or the releasing section 1122b by the returning member 140, the pressible part 124 of the restricting member 120 presses against the second side plates 115, and the opening 115a between the second side plates 115 leaves the pressible part 124 of the restricting member 120 exposed. In such a case, a flat-blade-shaped tool (not shown) may be used in an example to press the pressible part 124 of the restricting member 120 by passing through the opening 115a.

In addition, when the restricting member 120 is assembled to the fixing member 110, the bumps 125 press against the second fixing plate 112 so that the friction between the restricting member 120 and the fixing member 110 may be smaller for sliding the restricting member 120 smoothly.

The assembling assembly 200 includes a main body 210 and two assembling protrusions 220.

The main body 210 has a surface 211, a first groove 212 and a second groove 213. The first groove 212 inwardly extends from the surface 211. The first groove 212 has a first bottom surface 212a which is lower than and substantially parallel to the surface 211. The second groove 213 inwardly extends from the first bottom surface 212a. The second groove 213 has a second bottom surface 213a which is lower than the first bottom surface 212a and substantially parallel to the surface 211. In other words, both the first groove 212 and the second groove 213 inwardly extend from the surface 211. A depth D4 of the second groove 213 is greater than a depth D3 of the first groove 212. It is noted that the terms "substantially" may be utilized herein to represent the inherent degree of uncertainty that may be attributed to any quantitative comparison, value, measurement, or other representation.

Each of the assembling protrusions 220 includes a neck part 221 and a head part 222. One end of the neck part 221 is connected to the second bottom surface 213a of the second groove 213. The other end of the neck part 221 is connected to the head part 222. An outer diameter R1 of the neck part 221 matches the width D1 of the restricting section 1121b. An outer diameter R2 of the head part 222 is greater than the outer diameter R1 of the neck part 221 but is less than the width D2 of the releasing section 1122b.

The two assembling protrusions 220 of the assembling assembly 200 are slidable in the two through slots 112b, respectively, so that the two assembling protrusions 220 are able to be respectively located in the two restricting sections 1121b of the two through slots 112b or located in the two releasing sections 1122b of the two through slots 112b. When the two assembling protrusions 220 are respectively located in the two restricting sections 1121b of the two through slots 112b, and the two restricting protrusions 122 are respectively located in the through slots 112b, the two assembling protrusions 220 are respectively restricted to be in the two restricting sections 1121b of the two through slots 112b by the two restricting protrusions 122. Thus, the assembling assembly 200 is fixed to the frame 100.

In this embodiment, the assembling assembly 200 further includes a plurality of positioning protrusions 230 and a plurality of ribbed structures 240. In this embodiment, the quantity of the positioning protrusions 230 is three. The three positioning protrusions 230 protrude from the second bottom surface 213a and are respectively slidably located in the three positioning slots 112c1-112c3. Thus, the assembling assembly 200 is able to stably slide relative to the frame 100. In addition, the three-point positioning may limit the movement of the assembling assembly 200 so as to provide a foolproof configuration, thereby preventing the user from using the assembling assembly 200 wrongly.

The ribbed structures 240 are located on the first bottom surface 212a and the second bottom surface 213a. The purpose of the ribbed structure 240 is similar to that of the bumps 125. The ribbed structures 240 are designed to reduce the friction between the assembling assembly 200 and the frame 100, thus the assembling assembly 200 is able to slide smoothly.

In addition, in this embodiment, the difference (D4–D3) in depth between the first groove 212 and the second groove 213 matches the rise T between the first fixing plate 111 and the second fixing plate 112. Thus, when the two assembling protrusions 220 respectively penetrate through the two through slots 112b, the two first fixing plates 111 are slidably accommodated in the first groove 212, and the second fixing plate 112 is slidably accommodated in the second groove 213. That is, the whole frame 100 almost or completely sinks below the surface 211 of the main body 210 and may be hidden in the assembling assembly 200, and thus the appearance of the camera assembly set 1 is simpler and more beautiful.

The camera 20 is, for example, a single-lens camera, a dual-lens camera, a wide viewing-angle surveillance camera or a bullet-shaped surveillance camera. The camera 20 is connected to the assembling assembly 200 of the assembling set 10. The camera 20 is detachably fixed to the frame 100 of the assembling set 10 through the assembling assembly 200 of the assembling set 10. That is, the camera 20 is able to be detachably fixed on the object 2 through the frame 100 and the assembling assembly 200. In addition, in this embodiment, the assembling assembly 200 of the assembling set 10 is a part of the camera 20, but the present disclosure is not limited thereto. In other embodiments, the assembling assembly 200 can be independent from the camera 20 and detachably disposed on the camera 20.

Please refer to FIG. 6A to FIG. 9, which are schematic views showing that an assembling assembly is fixed to or detached from the frame according to the first embodiment of the disclosure.

Figure 6A:
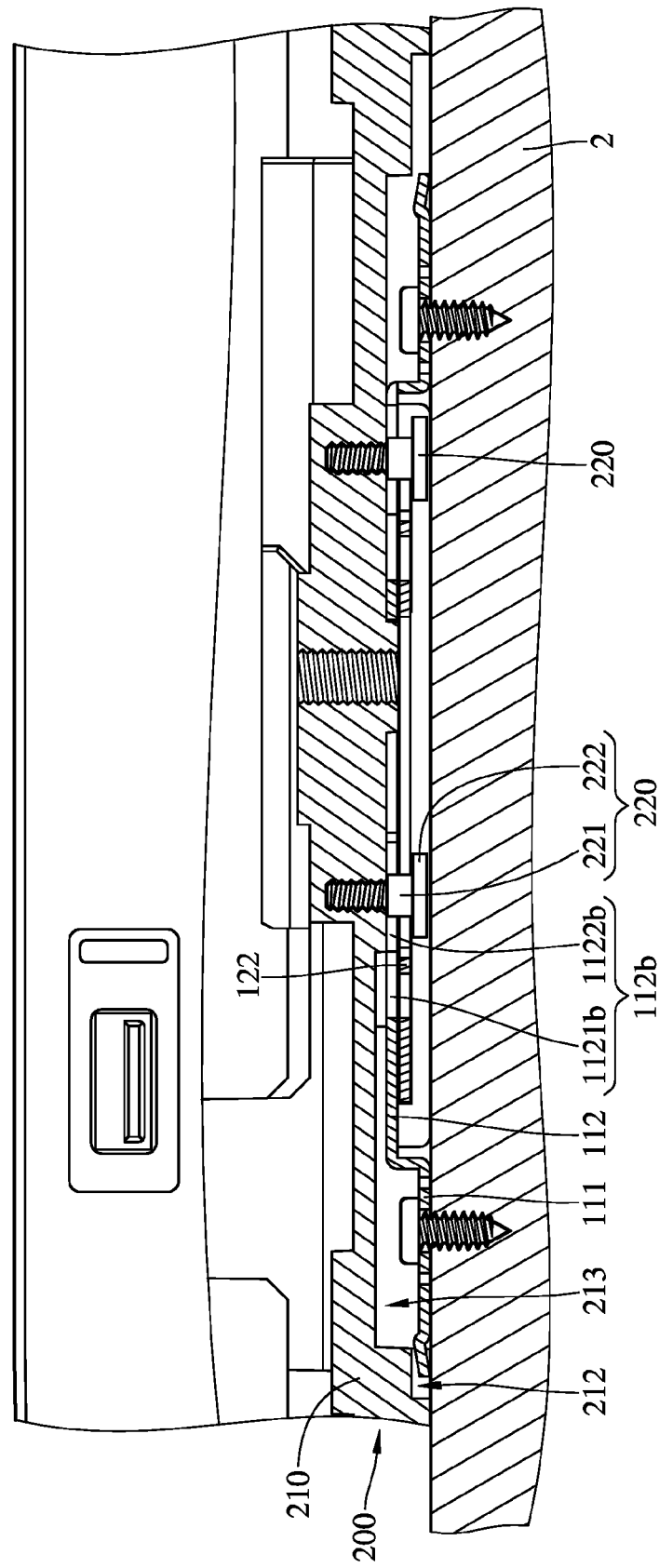
FIG. 6A to FIG. 9 are schematic views showing that an assembling assembly is fixed to or detached from the frame according to the first embodiment of the disclosure.
Figure 6B:
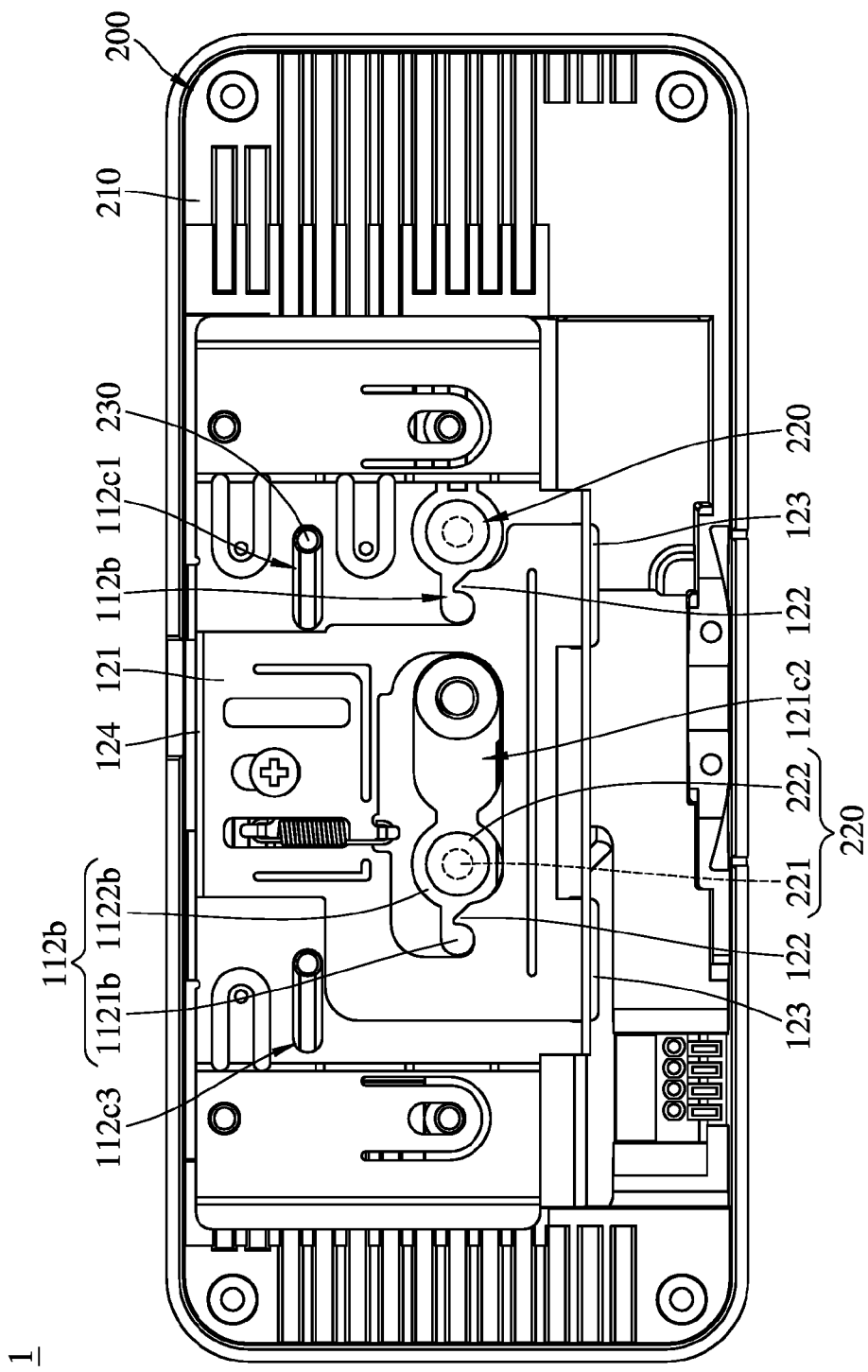

As shown in FIGS. 6A-6B, the assembling protrusions 220 of the assembling assembly 200 respectively penetrate through the releasing sections 1122b of the through slots 112b of the second fixing plate 112. In such a case, the two first fixing plates 111 of the fixing member 110 are accommodated in the first groove 212, and the second fixing plate 112 of the fixing member 110 and the restricting member 120 are accommodated in the second groove 213. Hence, the frame 100 is hidden in the assembling assembly 200 so that the appearance of the camera assembly set 1 is simpler and more beautiful.

In addition, through the configuration of the first fixing plates 111 accommodated in the first groove 212, the second fixing plate 112 accommodated in the second groove 213, and the positioning protrusions 230 respectively matching the positioning slots 112c1-112c3 (as shown in FIG. 6B), it may be easy for the user to respectively aim the two assembling protrusions 220 at the two through slots 112b even when the frame 100 is completely covered by the assembling assembly 200.

Figure 7A:
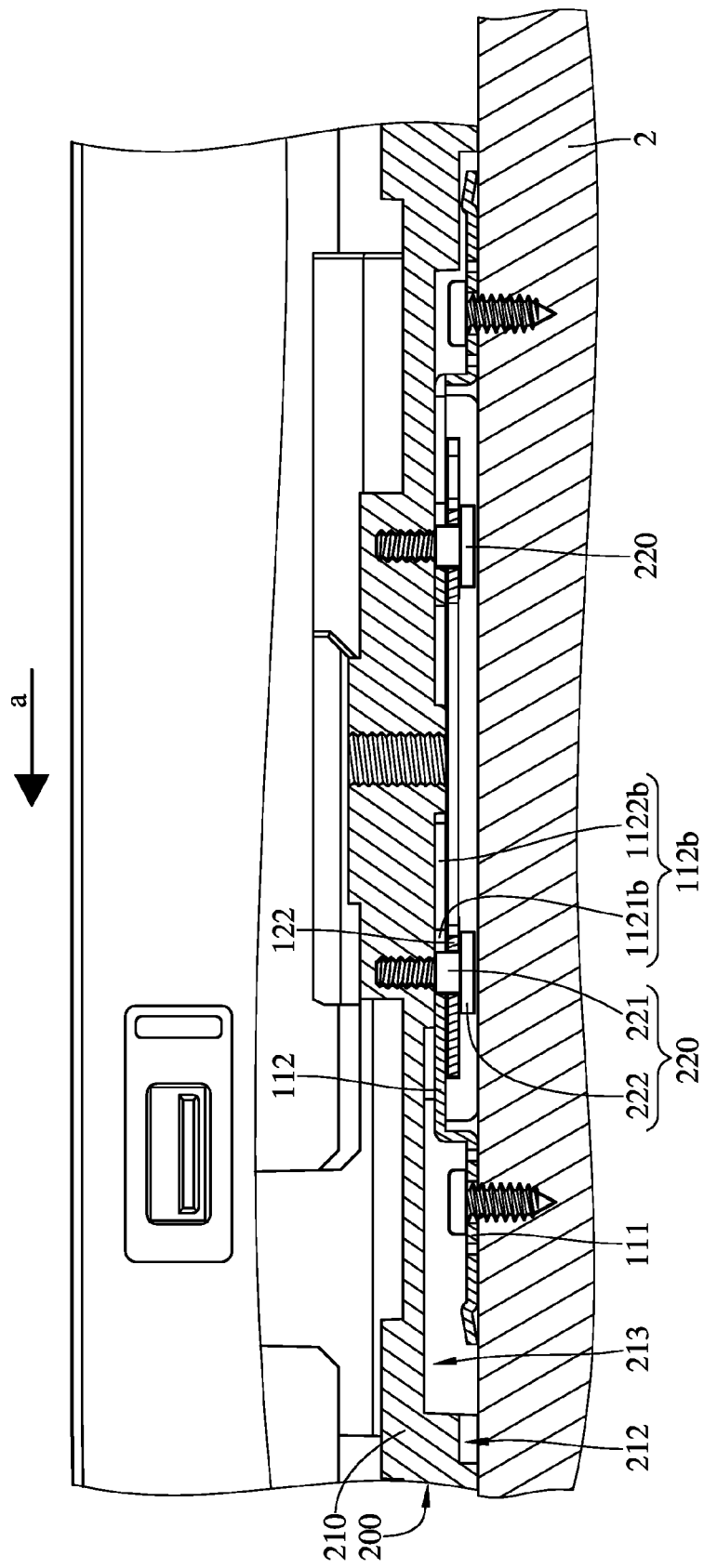
Figure 7B:
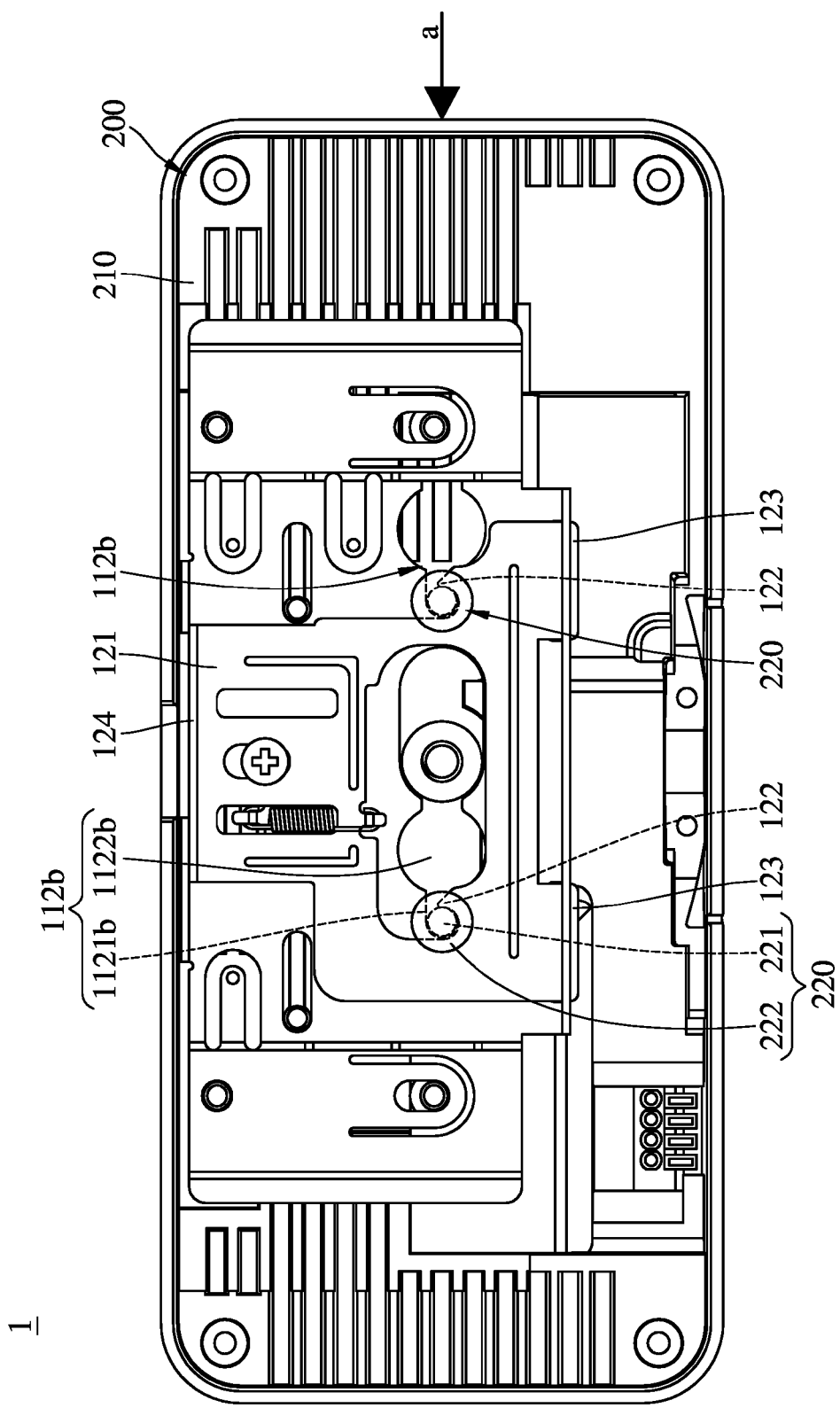

Then, as shown in FIGS. 7A-7B, the camera 20 is moved in a direction of arrow a. When the assembling protrusions 220 respectively press against the inclined surfaces of the restricting protrusions 122, the restricting protrusions 122 are moved out of the through slots 112b by the assembling protrusions 220 so that the assembling protrusions 220 are able to respectively slide into the restricting sections 1121b of the through slots 112b. When the assembling protrusions 220 are respectively located in the restricting sections 1121b of the through slots 112b, the restricting protrusions 122 are moved back to their original positions by the returning member 140, and the assembling protrusions 220 are respectively restricted to be in the restricting sections 1121b of the through slots 112b by the restricting protrusions 122. Thus, the assembling assembly 200 is fixed to the frame 100.

In addition, the ribbed structure 240 on the main body 210 is able to reduce the friction between the assembling assembly 200 and the frame 100 so that the assembling assembly 200 is able to slide smoothly.

Furthermore, the flexible arms 116 are disposed on two opposite sides of the second fixing plate 112 (as shown in FIG. 3). The flexible arms 116 press against the main body 210 of the assembling assembly 200 to prevent a gap between the main body 210 and the second fixed plate 112 from causing the assembling assembly 200 to slide unstably.

Figure 8:
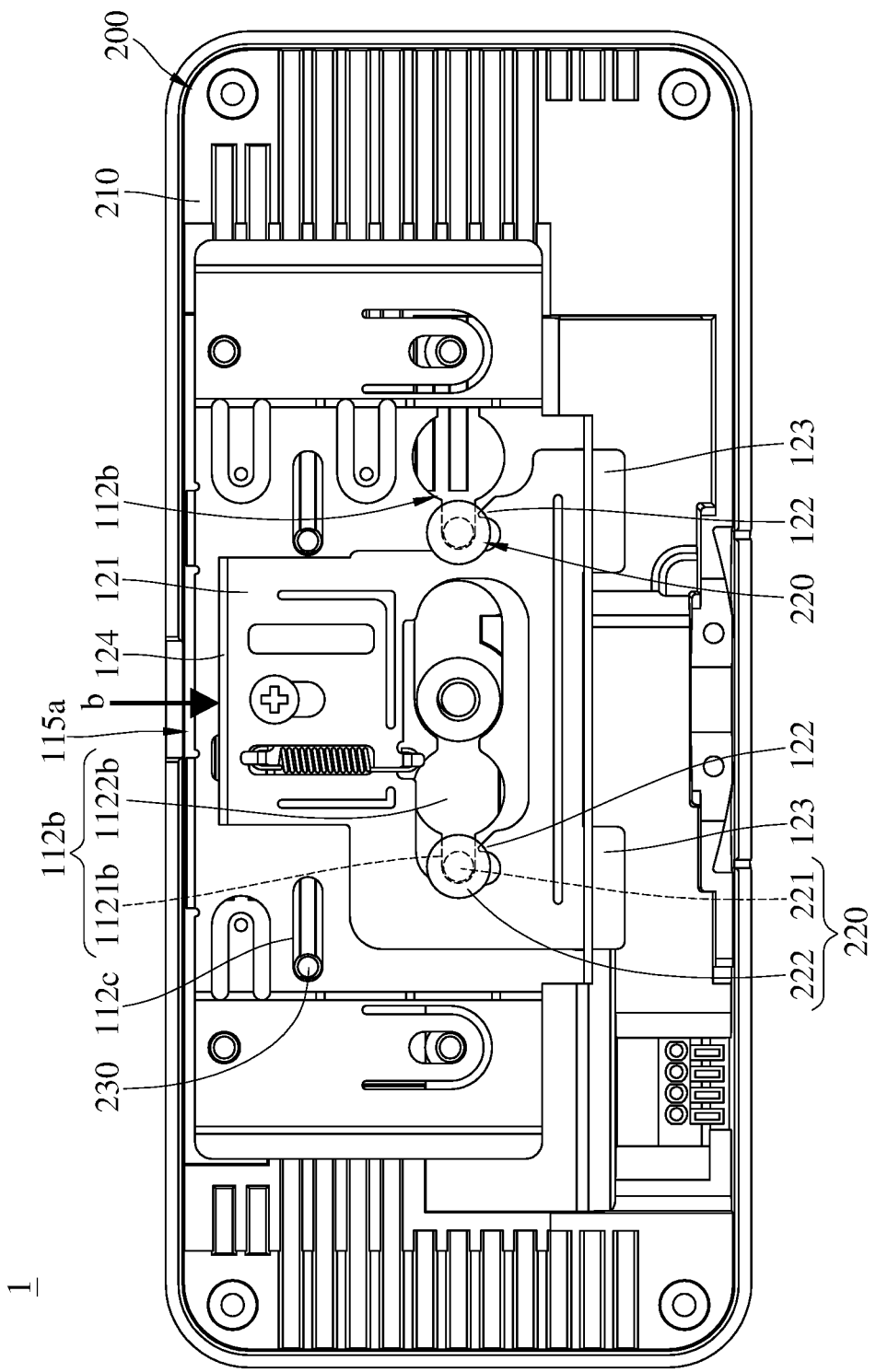

Then, when it is attempted to detach the camera 20 from the object 2, as shown in FIG. 8, the flat-blade-shaped tool (not shown) may be employed to press the pressible part 124 in a direction of arrow b by passing through the opening 115a in order to remove the constraint of the restricting protrusion 122 applied on the assembling protrusion 220.

Figure 9:
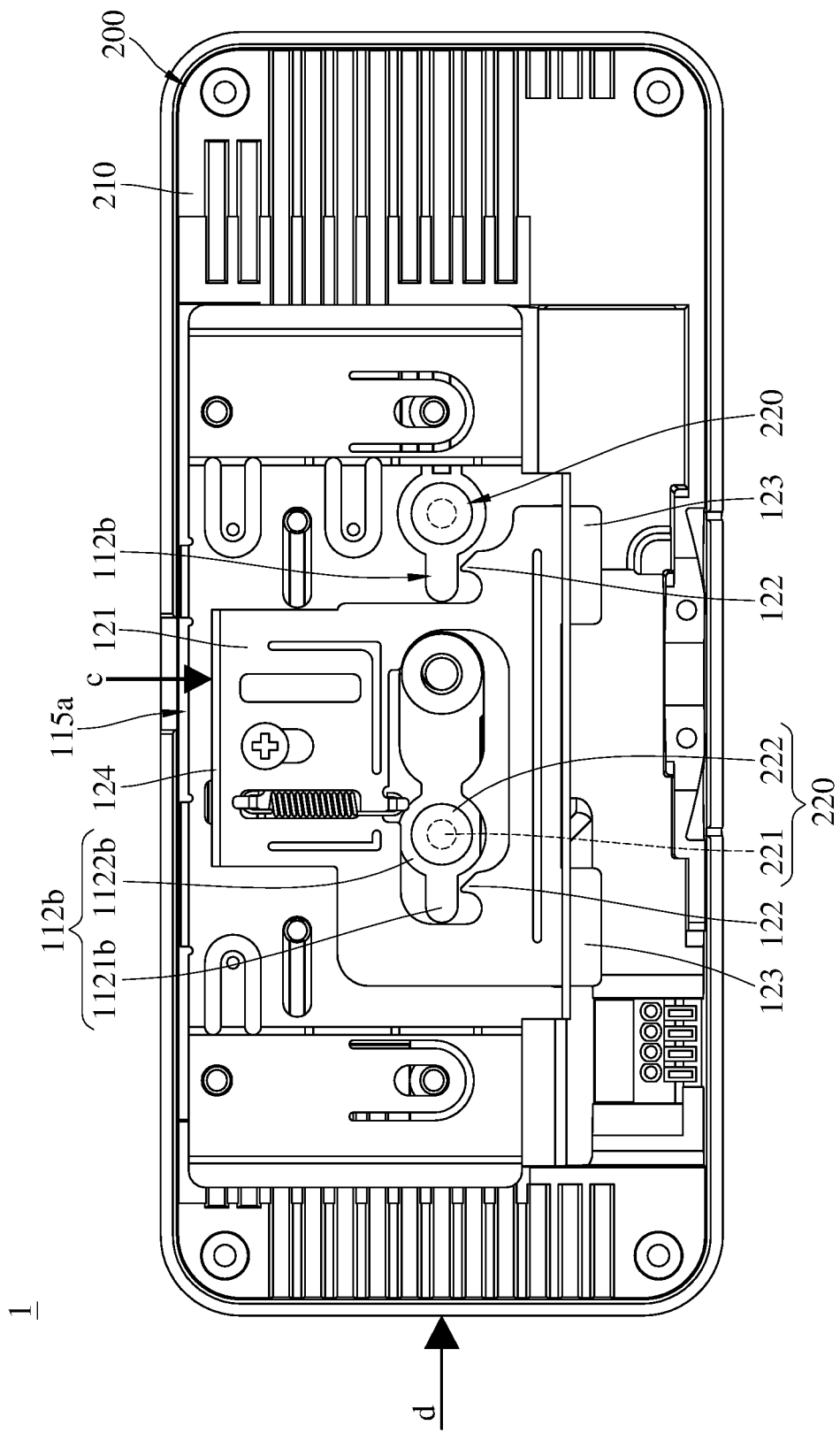

As shown in FIG. 9, the pressible part 124 of the restricting member 120 is pressed by the flat-blade-shaped tool in a direction of arrow c, and the camera 20 is moved in a direction of arrow d. In such a case, the assembling protrusions 220 are able to slide to the releasing sections 1122b of the through slots 112b and detached from the releasing sections 1122b. Accordingly, the camera 20 is able to be detached from the assembling set 10 efficiently.

According to the frame, the assembling set and the camera assembly set as discussed above, since the configuration of the through slot of the frame matching the assembling protrusion of the assembling assembly is incorporated with the slidable restricting member, the assembling protrusion of the assembling assembly is able to be efficiently restricted to be in the restricting section of the through slot or released from the releasing section of the through slot by sliding the assembling assembly.

In addition, when the assembling protrusion is located in the restricting section of the through slot, the assembling protrusion is restricted to be in the restricting section of the through slot by the restricting protrusion of the restricting member, so the assembling assembly is able to be fixed to the frame in an efficient manner. Then, when detaching the assembling assembly from the frame, it is only needed to remove the constraint applied on the assembling protrusion firstly and then to take the assembling protrusion out of the releasing section of the through slot. Hence, the camera can be fixed in an efficient manner by using the assembling set and the camera assembly set.

Moreover, since the rise between the first fixing plate and the second fixing plate, the restricting member and the returning member are able to be hidden in the depression of the frame. Furthermore, the frame is able to be hidden in the assembling assembly by the first groove and the second groove. Hence, the appearance of the camera assembly set is simple and beautiful.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. An assembling set, comprising:
 a frame comprising:
  a fixing member having at least one through slot, the at least one through slot having a restricting section and a releasing section which are connected to each other and extending along a first axis; and
  a restricting member comprising a main plate and at least one restricting protrusion, the main plate slidably disposed on the fixing member so that the at least one restricting protrusion is slidable in the at least one through slot along a second axis, and the second axis being nonparallel to the first axis; and
 an assembling assembly comprising a main body and at least one assembling protrusion, the at least one assembling protrusion protruding from the main body and being slidable in the at least one through slot so as to be restricted to be in the restricting section or released from the releasing section, wherein, when the at least one assembling protrusion is located in the restricting section of the at least one through slot, and the at least one restricting protrusion is located in the at least one through slot, the at least one assembling protrusion is restricted to be in the restricting section of the at least one through slot by the at least one restricting protrusion so that the assembling assembly is fixed to the frame.

2. The assembling set according to claim 1, wherein the main body has a surface and a first groove, the first groove is on the surface of the main body, when the at least one assembling protrusion of the assembling assembly is restricted to be in the restricting section of the at least one through slot, the frame is located in the first groove.

3. The assembling set according to claim 2, wherein the fixing member comprises at least one first fixing plate and a second fixing plate, the second fixing plate is connected to the at least one first fixing plate, the at least one first fixing plate and the second fixing plate have a rise therebetween and form a depression, and the main plate of the restricting member is slidably accommodated in the depression.

4. The assembling set according to claim 3, wherein the main body further has a second groove, the second groove is on the surface of the main body, a depth of the second groove is greater than a depth of the first groove, the rise between the first fixing plate and the second fixing plate matches a difference between the depth of the first groove and the depth of the second groove so that the first fixing plate is slidably located in the first groove, and the second fixing plate is slidably located in the second groove.

5. The assembling set according to claim 3, wherein the quantity of the at least one first fixing plate is two, the two first fixing plates are connected to two opposite sides of the second fixing plate, respectively, the fixing member further comprises a first side plate and a second side plate, the first side plate and the second side plate are located between the two first fixing plates and connected to the two opposite sides of the second fixing plate, respectively, the first side plate comprises at least one guiding slot, the restricting member further comprises at least one guiding protrusion connected to the main plate, the at least one guiding protrusion slidably penetrates through the at least one guiding slot so that the main plate is movable between the first side plate and the second side plate.

6. The assembling set according to claim 3, wherein the restricting member has at least one bump pressing against the second fixing plate.

7. The assembling set according to claim 3, wherein the frame further comprises a returning member disposed in the depression and connected between the fixing member and the restricting member so as to move the at least one restricting protrusion to be located in the at least one through slot.

8. The assembling set according to claim 3, wherein the fixing member further comprises a plurality of flexible arms located at two opposite sides of the second fixing plate, one end of the plurality of flexible arms is connected to the second fixing plate, and the other end of the plurality of flexible arms press against the main body.

9. The assembling set according to claim 3, wherein the second fixing plate further comprises at least one positioning slot, the assembling assembly further comprises at least one positioning protrusion which protrudes from the main body and is slidable in the at least one positioning slot.

10. The assembling set according to claim 9, wherein a width of the restricting section is less than a width of the releasing section, the at least one assembling protrusion comprises a neck part and a head part, the neck part is connected to the head part, an outer diameter of the neck part matches the width of the restricting section, an outer diameter of the head part is greater than the outer diameter of the neck part and less than the width of the releasing section.

11. A frame, comprising:
 a fixing member having at least one through slot, the at least one through slot having an restricting section and a releasing section which are connected to each other and extending along a first axis, wherein the fixing member comprises at least one first fixing plate and a second fixing plate, the second fixing plate is connected to the at least one first fixing plate, the at least one first fixing plate and the second fixing plate have a rise therebetween and form a depression, and the main plate of the restricting member is slidably accommodated in the depression;
 a restricting member comprising a main plate and at least one restricting protrusion, the main plate slidably disposed on the fixing member so that the at least one restricting protrusion is slidable in the at least one through slot along a second axis, and the second axis being nonparallel to the first axis; and
 a returning member disposed in the depression and connected between the fixing member and the restricting member so as to move the at least one restricting protrusion to be located in the at least one through slot.

12. A camera assembly set comprising:
an assembling set comprising:
a frame comprising:
a fixing member having at least one through slot, the at least one through slot having an restricting section and a releasing section which are connected to each other and extending along a first axis; and
a restricting member comprising a main plate and at least one restricting protrusion, the main plate slidably disposed on the fixing member so that the at least one restricting protrusion is slidable in the at least one through slot along a second axis, and the second axis being nonparallel to the first axis; and
an assembling assembly comprising a main body and at least one assembling protrusion, the at least one assembling protrusion protruding from the main body and being slidable in the at least one through slot so as to be restricted in the restricting section or released from the releasing section, wherein, when the at least one assembling protrusion is located in the restricting section of the at least one through slot, and the at least one restricting protrusion is located in the at least one through slot, the at least one assembling protrusion is restricted to be in the restricting section of the at least one through slot by the at least one restricting protrusion so that the assembling assembly is fixed to the frame; and
a camera disposed on the assembling assembly of the assembling set and detachably fixed to the frame of the assembling set through the assembling assembly of the assembling set.

13. The camera assembly set according to claim 12, wherein the main body has a surface and a first groove, the first groove is on the surface of the main body, when the at least one assembling protrusion of the assembling assembly is restricted to be in the restricting section of the at least one through slot, the frame is located in the first groove.

14. The camera assembly set according to claim 13, wherein the fixing member comprises at least one first fixing plate and a second fixing plate, the second fixing plate is connected to the at least one first fixing plate, the at least one first fixing plate and the second fixing plate have a rise therebetween and form a depression, and the main plate of the restricting member is slidably accommodated in the depression.

15. The camera assembly set according to claim 14, wherein the main body further has a second groove, the second groove is on the surface of the main body, a depth of the second groove is greater than a depth of the first groove, the rise between the first fixing plate and the second fixing plate matches a difference between the depth of the first groove and the depth of the second groove so that the first fixing plate is slidably located in the first groove, and the second fixing plate is slidably located in the second groove.

16. The camera assembly set according to claim 14, wherein the quantity of the at least one first fixing plate is two, the two first fixing plates are connected to two opposite sides of the second fixing plate, respectively, the fixing member further comprises a first side plate and a second side plate, the first side plate and the second side plate are located between the two first fixing plates and connected to the two opposite sides of the second fixing plate, respectively, the first side plate comprises at least one guiding slot, the restricting member further comprises at least one guiding protrusion connected to the main plate, the at least one guiding protrusion slidably penetrates through the at least one guiding slot so that the main plate is movable between the first side plate and the second side plate.

17. The camera assembly set according to claim 14, wherein the restricting member has at least one bump pressing against the second fixing plate.

18. The camera assembly set according to claim 14, wherein the frame further comprises a returning member disposed in the depression and connected between the fixing member and the restricting member so as to move the at least one restricting protrusion to be located in the at least one through slot.

19. The camera assembly set according to claim 14, wherein the fixing member further comprises a plurality of flexible arms located at two opposite sides of the second fixing plate, one end of the plurality of flexible arms is connected to the second fixing plate, and the other end of the plurality of flexible arms press against the main body.

20. The camera assembly set according to claim 14, wherein the second fixing plate further comprises at least one positioning slot, the assembling assembly further comprises at least one positioning protrusion which protrudes from the main body and is slidable in the at least one positioning slot.

21. The camera assembly set according to claim 20, wherein a width of the restricting section is less than a width of the releasing section, the at least one assembling protrusion comprises a neck part and a head part, the neck part is connected to the head part, an outer diameter of the neck part matches the width of the restricting section, an outer diameter of the head part is greater than the outer diameter of the neck part and less than the width of the releasing section.

* * * * *